United States Patent
Cooney et al.

(10) Patent No.: US 6,504,730 B1
(45) Date of Patent: Jan. 7, 2003

(54) SERVICEABLE POWER MODULES FOR A POWER DISTRIBUTION ASSEMBLY

(75) Inventors: Robert C. Cooney, Janesville, WI (US); John A. Dickey, Rockford, IL (US); Mark W. Metzler, Davis, IL (US); Bruce D. Beneditz, Roscoe, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 0 days.

(21) Appl. No.: 09/911,751

(22) Filed: Jul. 23, 2001

(51) Int. Cl.⁷ .............................. H02B 1/00; H02B 1/20; H01R 12/02; H01R 12/14; H05K 7/02

(52) U.S. Cl. .................. 361/826; 361/827; 361/788; 361/796; 361/797; 361/752; 174/50; 174/72 A; 439/61; 439/62

(58) Field of Search .................... 361/752–753, 361/759, 796–98, 801–803, 826–828, 785, 788; 174/50, 50.51, 52, 56, 50.6, 53, 59, 72 A; 439/61, 62

(56) References Cited

U.S. PATENT DOCUMENTS

| | | |
|---|---|---|
| 3,488,563 A | 1/1970 | Caruthers |
| 4,288,838 A | 9/1981 | Van Der Vegte |
| 4,333,702 A | 6/1982 | Herrmann |
| 4,493,018 A | 1/1985 | Hopmayer |
| 4,672,511 A | 6/1987 | Meusel |
| 4,920,453 A * | 4/1990 | Onose et al. ............... 361/392 |
| 4,942,499 A | 7/1990 | Shibata |
| 5,103,378 A * | 4/1992 | Stowers et al. ............. 361/415 |
| 5,119,268 A | 6/1992 | Brown |
| 5,168,842 A | 12/1992 | Brooks |
| 5,388,995 A * | 2/1995 | Rudy, Jr. et al. ............. 439/61 |
| 5,775,956 A | 7/1998 | Sticker |
| 5,793,218 A * | 8/1998 | Oster et al. ................. 324/754 |
| 6,243,273 B1 * | 6/2001 | Beun et al. ................. 361/796 |
| 6,351,786 B2 * | 2/2002 | Elmore et al. ............. 710/303 |
| 6,394,815 B1 * | 5/2002 | Sarno et al. ................. 439/61 |

* cited by examiner

Primary Examiner—David Martin
Assistant Examiner—Dameon E. Levi
(74) Attorney, Agent, or Firm—Carlson, Gaskey & Olds

(57) ABSTRACT

A power distribution assembly (PDA) includes AC and/or DC power modules and control modules that are installed within a chassis that is mounted to a vehicle, such as an aircraft. Each module includes a wiring harness connector and a control connector for attachment to a motherboard. A wiring harness is externally mounted to the chassis to provide a simplified connection for the wiring harness connector. The modules can be individually and selectively removed from the chassis for repair or replacement without having to remove the entire PDA from the aircraft. This is accomplished by simply removing the module from the chassis, thereby disconnecting the aircraft interface and motherboard connectors for the selected modules. Also, a common PDA can be utilized on different types of aircraft by installing desired modules within the chassis. Thus, the number and type of modules are selected to meet predetermined specifications for a specific aircraft and then installed within a PDA common to all aircraft.

44 Claims, 9 Drawing Sheets

SERVICEABLE POWER MODULES FOR A POWER DISTRIBUTION ASSEMBLY

BACKGROUND OF THE INVENTION

This invention relates to a power distribution assembly that utilizes multiple power and control modules that can be easily removed for repair or replacement without requiring removal of all modules.

Typically vehicles, such as an aircraft, utilize a secondary power distribution assembly (SPDA) to distribute power from a primary source to various aircraft systems. An SPDA includes a chassis that is mounted within the vehicle and which houses multiple power modules that are used to power the aircraft systems. These power modules can be solely DC modules, solely AC modules, or a combination of DC and AC modules installed within a common SPDA. Control modules are also housed within the SPDA, for functions such as communications, microprocessing, etc. The power modules interact with the control modules to provide proper communication and control of power for each of the aircraft systems.

Traditionally, a SPDA includes an internally mounted wiring harness for connecting multiple power cables from the various aircraft systems to the proper power module. Each different type of aircraft includes a specially designed SPDA that includes power modules that meet that aircraft's predetermined specifications. Thus, each different SPDA requires a different wiring harness design and power module configuration, resulting in proliferation of components.

One disadvantage with previous SPDA designs is that a module is considered to be a shop replaceable unit (SRU), i.e., when a module fails, the entire SPDA must be removed from the aircraft in order to repair or replace the module. This repair is performed in a service shop. This requires disconnecting multiple aircraft systems when only one specific system's module is inoperable. Once the defective module has been replaced, all of the modules within the SPDA must be reconnected to their respective systems with each connection requiring post-repair verification. This can involve testing thousands of connections resulting in significant time and labor costs.

It is desirable to provide an improved SPDA with modules that are line replaceable modules (LRMs) such that each module can be individually removed from the SPDA chassis without requiring removal of the SPDA from the aircraft or removal of other modules from the SPDA. It is also desirable to provide a common SPDA that can be used on different aircraft types. The SPDA should be able to utilize any combination of AC and/or DC power modules with separate AC and DC busses incorporated into the aircraft wiring harness in addition to overcoming the above referenced deficiencies with prior art systems

SUMMARY OF THE INVENTION

The subject invention provides a modular design for a power distribution assembly including a secondary power distribution assembly (SPDA). The SPDA includes AC and/or DC power modules and control modules that are installed within a vehicle mounted chassis. The modules can be individually and selectively removed from the chassis for repair or replacement without having to remove the entire SPDA from the aircraft. Further, modules can be grouped into families for installation into a specific vehicle type. Thus, a common SPDA can be used for all vehicle types by simply changing the power module family to meet the vehicle's specifications.

Each power module includes a connector for attachment to an aircraft wiring harness and a control connector for attachment to a motherboard. The aircraft wiring harness is external to the SPDA and connects directly to the individual module wiring harness connector. The modules can be individually and selectively removed from the chassis for repair or replacement without having to remove the entire SPDA from the aircraft by simply removing the module from the chassis thereby, disconnecting the wiring harness and motherboard connectors for the selected modules. AC and/or DC modules can be used in a common SPDA and separate AC and DC buses are maintained.

The chassis includes a plurality of installation slots for receiving the modules. Typically, there are more installation slots than modules installed within the chassis such that multiple vehicle types can utilize a common SPDA. After each module is installed within a slot, a protective mounting plate is optionally installed over each module to enclose the module within the chassis. The mounting plate includes an identification portion for uniquely identifying the module covered by that plate.

In one embodiment, aircraft interface and control connectors are mounted to opposite ends of the power module. The aircraft interface connector has both power contacts and signal contacts. The power contacts provide a power feed to the power module and provide output power to loads requiring high current. The signal contacts provide output power to loads requiring low current and provide the configuration pins for the loads serviced by the respective module.

In another embodiment, aircraft interface and control connectors are mounted on a common end of the module. The aircraft interface and control connectors are simultaneously mated with the motherboard and aircraft wiring harness respectively when each of the power modules is installed within the chassis. The connectors are keyed to ensure the proper power module is being installed in each slot within the chassis.

In another embodiment, the chassis includes a control section and a power module section. The control section includes installation slots for receiving control modules and the power module section includes installation slots for receiving the power modules. In one orientation, the control module installation slots are transverse to the power module slots, while in an alternate orientation the control module and power module slots are parallel to each other.

These and other features of the present invention can be best understood from the following specification and drawings, the following of which is a brief description.

DETAILED DESCRIPTION OF AN EXEMPLARY EMBODIMENT

Figure 1:
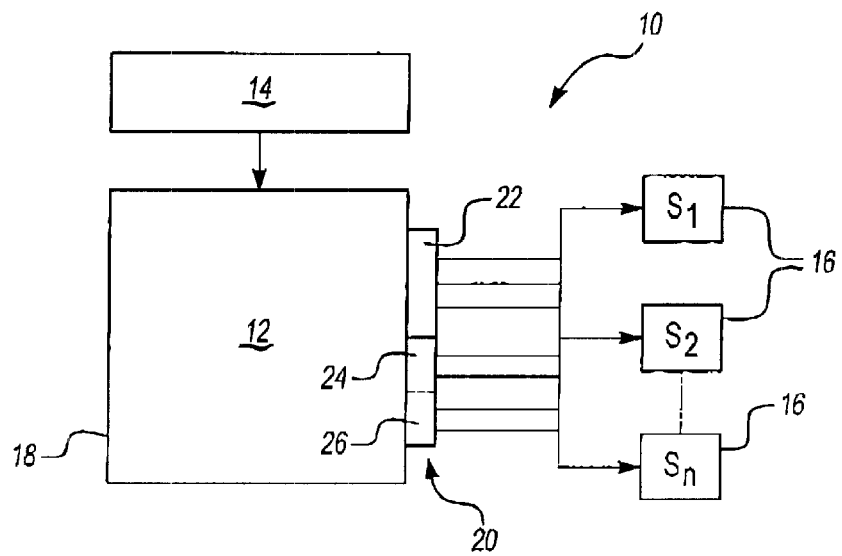
FIG. 1 is a schematic view of a secondary power distribution system incorporating the subject invention.

Referring to FIG. 1, a vehicle power distribution system is shown generally at 10. This system 10 is used in a vehicle, such as an aircraft, and includes a secondary power distribution assembly (SPDA) 12 that distributes power from a primary source 14 to various aircraft systems 16, such as fuel, hydraulic, and brake systems. The subject invention is preferably incorporated into an SPDA system, however, the invention could also be used in other power distribution systems.

The SPDA includes a chassis 18 that is installed within the aircraft and a wiring harness 20 that is externally mounted to the chassis 18. The wiring harness 18 can be configured for AC and/or DC power distribution. When both AC and DC power are required, the wiring harness 20 provides an AC bus 22 that is independently wired from a DC bus 24 as schematically shown in FIG. 1. Further, in some configurations, the DC load is shared between the DC bus 24 and an essential bus 26. The DC bus 24 and essential bus 26 also need to be maintained separately in the aircraft and SPDA wiring harness 20.

Figure 2:
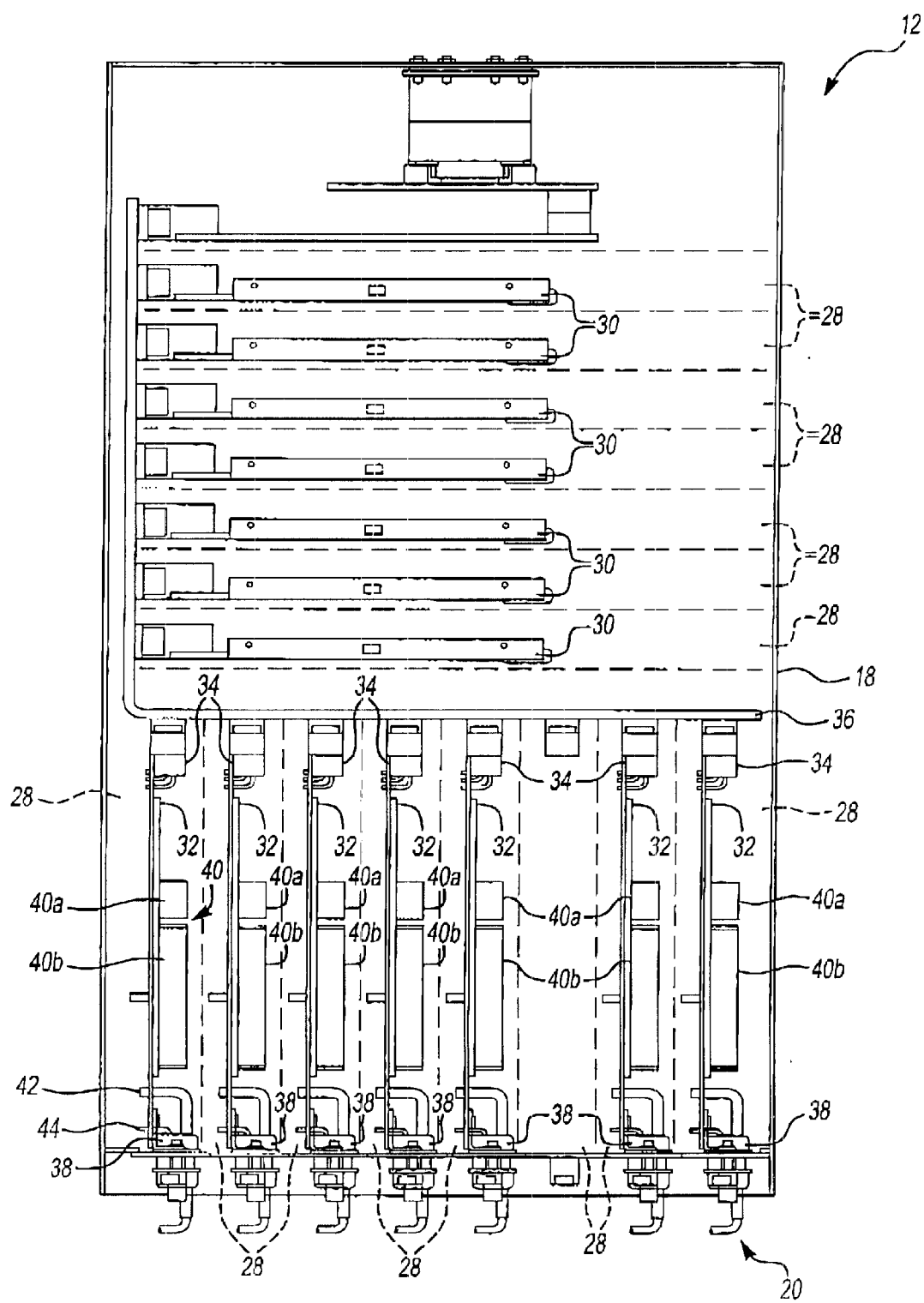
FIG. 2 is a top view of one embodiment of the secondary power distribution system of FIG. 1.

The SPDA 12 includes multiple modules, shown in FIG. 2, that are installed within installation slots 28 in the chassis 18. The modules are installed within the installation slots 28 in a similar manner as plug-in cards for attachment to a universal motherboard in a personal computer. For the subject SPDA 12, some of the modules are control boards 30 and some of the modules are power modules 32 that can be selectively and individually detached from the chassis 18 for repair or replacement without requiring removal of the other power modules 32. The control boards 30 are related to such operations as analog input, discrete input/output, communications, microprocessors, etc. The control boards 30 are considered to be shop replaceable units (SRUs).

The subject SPDA 12 can have more installation slots 28 formed within the chassis 18 than are necessary for the number of power modules 32 required for the application. For example, FIG. 2 shows one (1) empty installation slot 28. This design configuration provides a common SPDA 12 that can be used on different types of aircraft. Families of power modules 32 are formed to meet the predetermined specifications for each unique aircraft. Thus, aircrafts that require solely DC power modules would have a DC power module family and aircrafts that require both AC and DC power modules would have a dual power module family. The appropriate modules 32 are selected to form the desired family and then the modules 32 are installed within the chassis 18 that is common to all aircraft types to meet the aircraft's specifications. Using standard modules 32 in this manner reduces cost and design time while still providing design flexibility.

Being able to selectively and individually remove power modules 32 for repair and replacement also reduces aircraft downtime as well as providing decreased labor and maintenance costs. This design makes the power modules 32 line replaceable modules (LRMs), meaning that the power modules 32 can be separately removed without requiring removal of the entire SPDA 12 from the aircraft as has been traditionally done. Traditionally, when the entire SPDA is removed, all systems are disconnected just to repair a power module that affects only one system or a small subset of systems. This results in thousands of electrical connections that have to be verified and tested once the SPDA is re-installed within the aircraft, which is time consuming and labor intensive. The subject SPDA 12 with LRM power modules 32 significantly reduces the post-repair verification time because only that specific module's connections need to be verified.

Each power module 32 includes a motherboard connector 34 for attachment to a motherboard 36 and an aircraft interface connector 38 for attachment to the wiring harness 20. The connection to the motherboard 36 provides an interface to the microprocessor control board 30. The microprocessor control board 30, through the use of configuration pins in the motherboard connector 34 or through communication over the motherboard 36, knows the type of module 30 or 32 that is being connected to the SPDA 12 within the respective installation slot 28. If the microprocessor is designed appropriately, the microprocessor can control remotely located power modules, which would allow load control to be located as close as possible to the actual load system.

To provide flexibility, each power module 32 can be of many different types. One type of module utilizes Solid State Power Controllers (SSPCs) 40 to control multiple loads. Some of the SSPCs 40a have a fixed amp per load setting and/or some of the SSPCs 40b have a programmable amp per load setting. The combination of fixed 40a and programmable 40b SSPCs is tailored to the specific application.

Also, as discussed above, the power modules 32 can control AC loads. The size and quantity of the SSPCs 40 on any given power module 32 is set according to a desired specification and the SPDA 12 is designed such that a variety of power modules 12 is supported including any combination of AC and DC modules.

The aircraft interface connector 38 for attachment to the wiring harness 20 has both power contacts 42 and signal contacts 44. The power contacts 42 provide the power feed to the power module 32 and provide output power to those loads that require high current. The signal contacts 44 provide output power for low current loads and provide configuration pins for the loads. The wiring harness 20 includes cables that are strapped using the configuration pins to identify each cable uniquely from other cables. Thus, a single power module 32 can have SSPCs 40b programmed to different current levels as determined by the load requirements. When the aircraft interface connector 38 is mated to the power module 32, the module 32 is programmed for the specific loads on that cable.

The aircraft interface connector 38 is preferably a combination subminiature-D connector, however other similar know connectors in the art can also be used. This type of connector is preferred because it is available in a filtered pin version for improved electro-magnetic interference (EMI) and high infra-red frequency (HIRF) performance.

As shown in FIG. 2, the aircraft interface 38 and motherboard 34 connectors are mounted to opposite ends of the power module 32. This provides a protected connection to the motherboard 36 while providing the load connection at the free end of the SPDA 12. This configuration provides several benefits. For example, because the wiring harness is externally mounted to the chassis 18, heat generation is external to the SPDA 12 as opposed to being inside the unit, which will result in improved thermal performance. The externally mounted wiring harness 20 also simplifies bus separation. The AC harness is easily kept separate from the DC harness due to the power module configuration. Interface concerns associated with the wiring harness 20 are now external to the SPDA 12, which simplifies the protection requirements of the SPDA 12.

Figure 3:
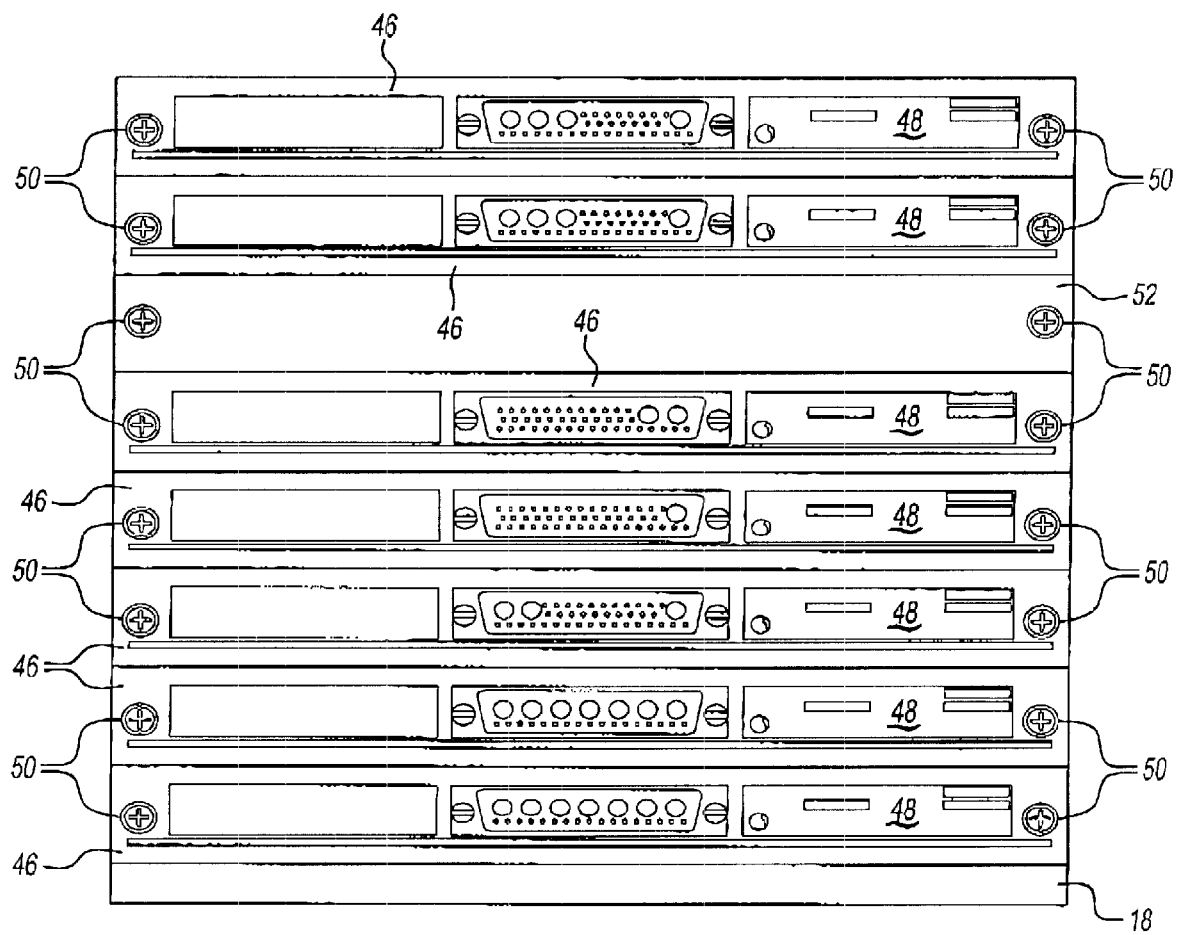
FIG. 3 is a front view of the secondary power distribution system of FIG. 2.

As shown in FIG. 3, each free end of a power module 32 has a metal mounting plate 46 attached to the module 32 and the aircraft interface connector 38. The mounting plate 46 includes an identification portion 48 that identifies the type of module 32 mounted inside the chassis in that installation slot 28. Preferably, the mounting plate 46 includes a pair of fasteners 50 that secure the power module 32 to the SPDA chassis 18. Once all power modules 32 have been installed in the installation slots 28, the mounting plates 46 form a cover. This cover protects the modules 32 from debris and other external contaminants and provides a conductive barrier. Blank mounting plates 52 are used to cover empty installation slots 28.

While FIG. 2 shows a configuration where the control boards 30 are mounted transversely to the power modules 32, alternate configurations could also be used. For example, in FIG. 4, the power modules 32 and control boards 30 are parallel to each other. In this configuration, the chassis 18 is wide and shallow as opposed to narrow and deep. The control boards 30 would have motherboard connectors 34, aircraft interface connectors 38 and mounting plates 46 similar to those of the power modules 32.

Figure 5:
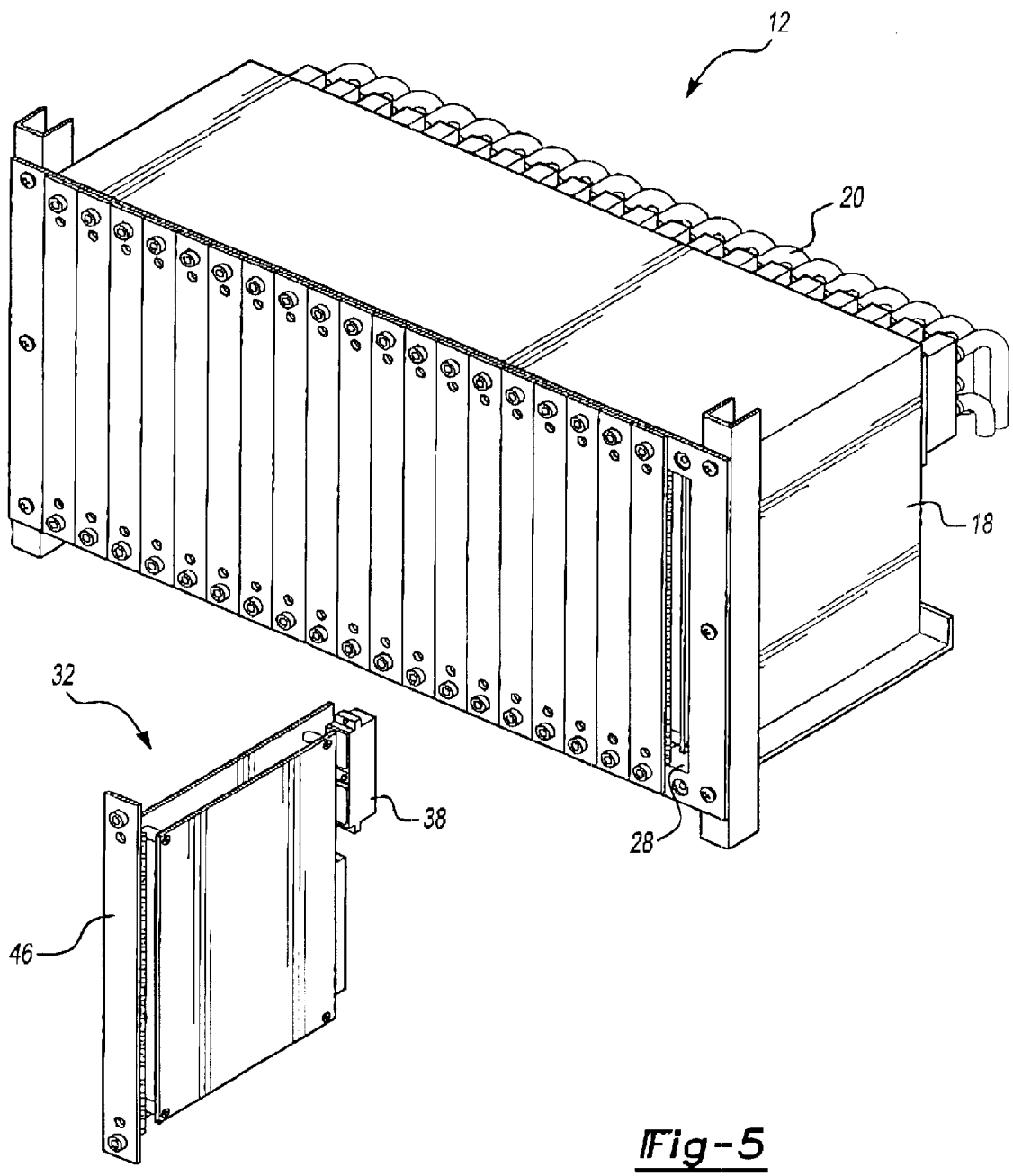
FIG. 5 is an exploded view of an alternate embodiment incorporating the subject invention.
Figure 6:
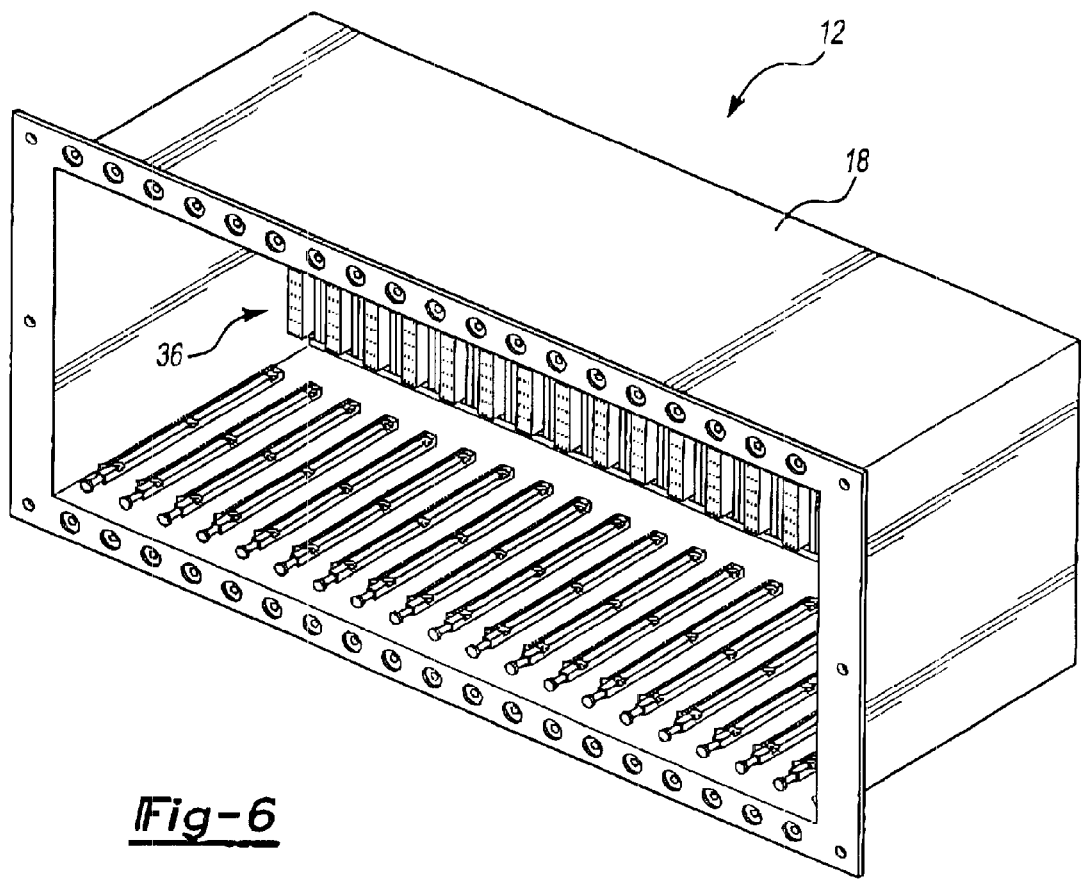
FIG. 6 is a perspective view of a chassis from the embodiment of FIG. 5.
Figure 7:
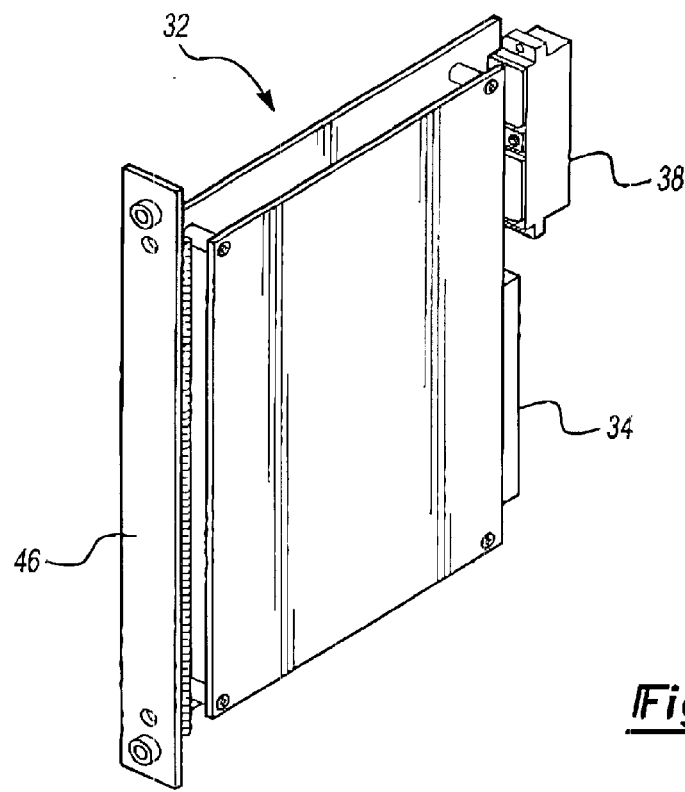
FIG. 7 is a perspective view of a power module from the embodiment of FIG. 5.

In the preferred embodiment, shown in FIGS. 5–7, the aircraft interface connector 38 and motherboard connector 34 are located on the same end of each power module 32. In this configuration both connectors 34, 38 are mated nearly simultaneously when the module 30, 32 is installed within the chassis 18. This reduces the overall number of connectors and reduces assembly time and cost. The motherboard connector 34 is the same for each installation slot 28 within the chassis. Thus, any type of module can be installed in any slot 28. The aircraft interface connector 38 is keyed to ensure that the appropriate power module 32 is being installed within each slot 28.

FIG. 5 shows a populated SPDA 12 with one module 32 left for installation. The aircraft wiring harness 20 is externally mounted on the rear of the chassis 18 to provide the benefits discussed above. In addition, locating the wiring harness 20 on the back or inside portion of the SPDA 12 reduces the possibility of damage to the wiring harness 20 and connectors 34, 38.

FIG. 6 shows the mating connectors on the motherboard 36 near the back part of the chassis 18 for internal connection. FIG. 7 shows an individual module 32 with both the aircraft interface connector 38 and the motherboard connector 34 on the same end. As each power module 32 is inserted into each slot 28, the motherboard connector 34 mates with the motherboard 36 and the aircraft interface connector 38 mates with the aircraft wiring harness 20 nearly at the same time. The mounting plate 46 is then fastened into place.

Figure 8:
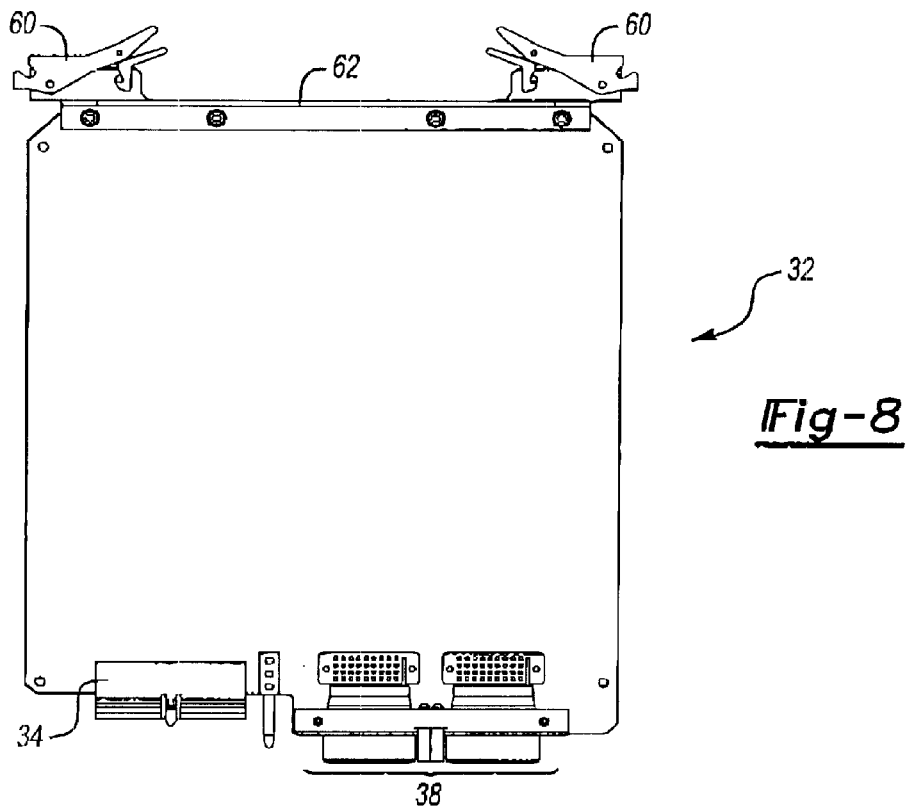
FIG. 8 is a top view of an alternate embodiment of a module.
Figure 9:
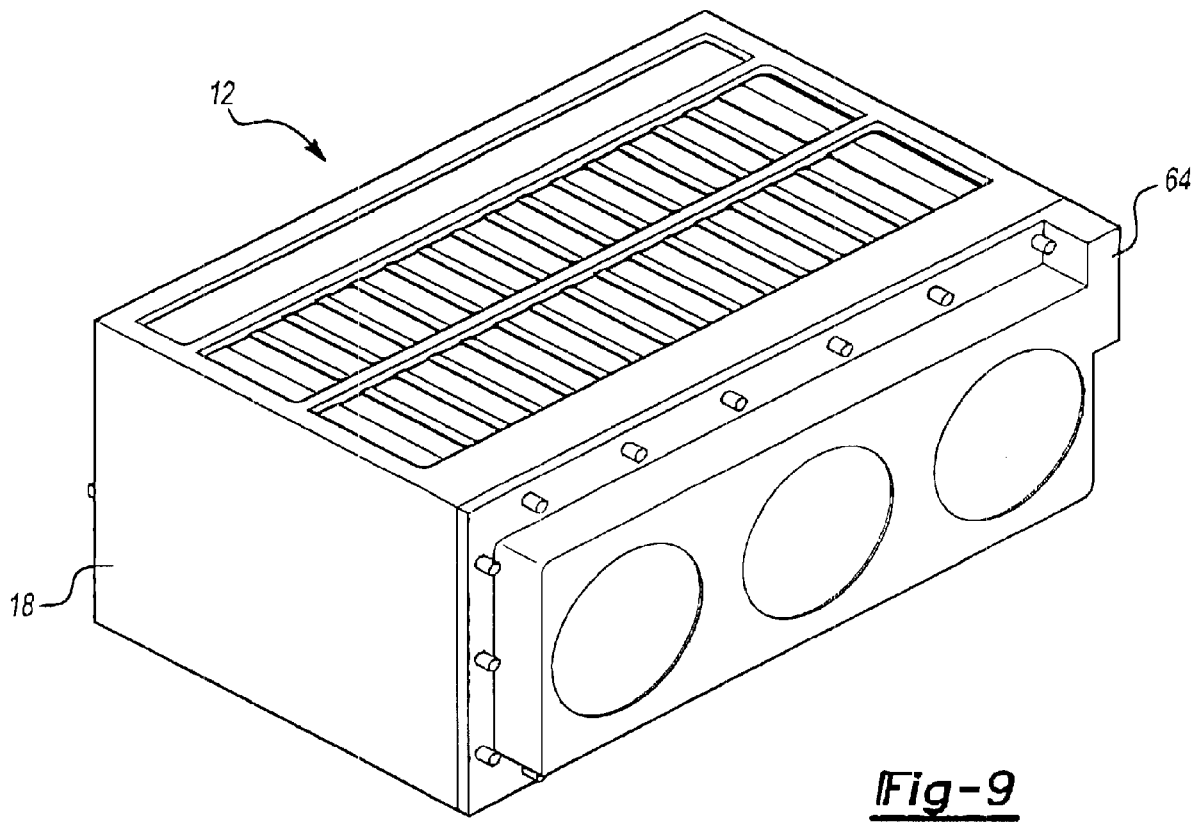
FIG. 9 is a perspective view of an alternate embodiment with a removable cover.

In an alternate embodiment, the modules 32 are secured to the chassis 18 using lever actuated inserter/extractors 60, shown in FIG. 8. A stiffener 62 is also included to reduce vibrations. The operation and structure of the lever actuated inserter/extractors 60 and stiffeners 62 is well known and will not be discussed in detail. A removable cover 64, shown in FIG. 9, is then secured to the chassis 18 to enclose the modules 32.

Figure 4:
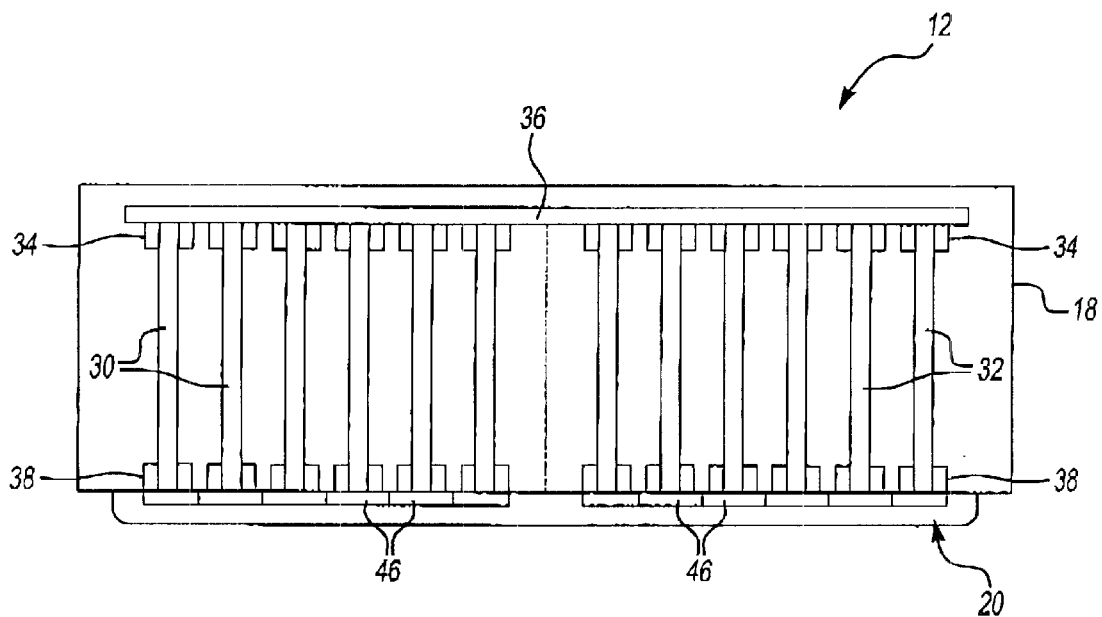
FIG. 4 is a schematic view of an alternate embodiment incorporating the subject invention.
Figure 10:
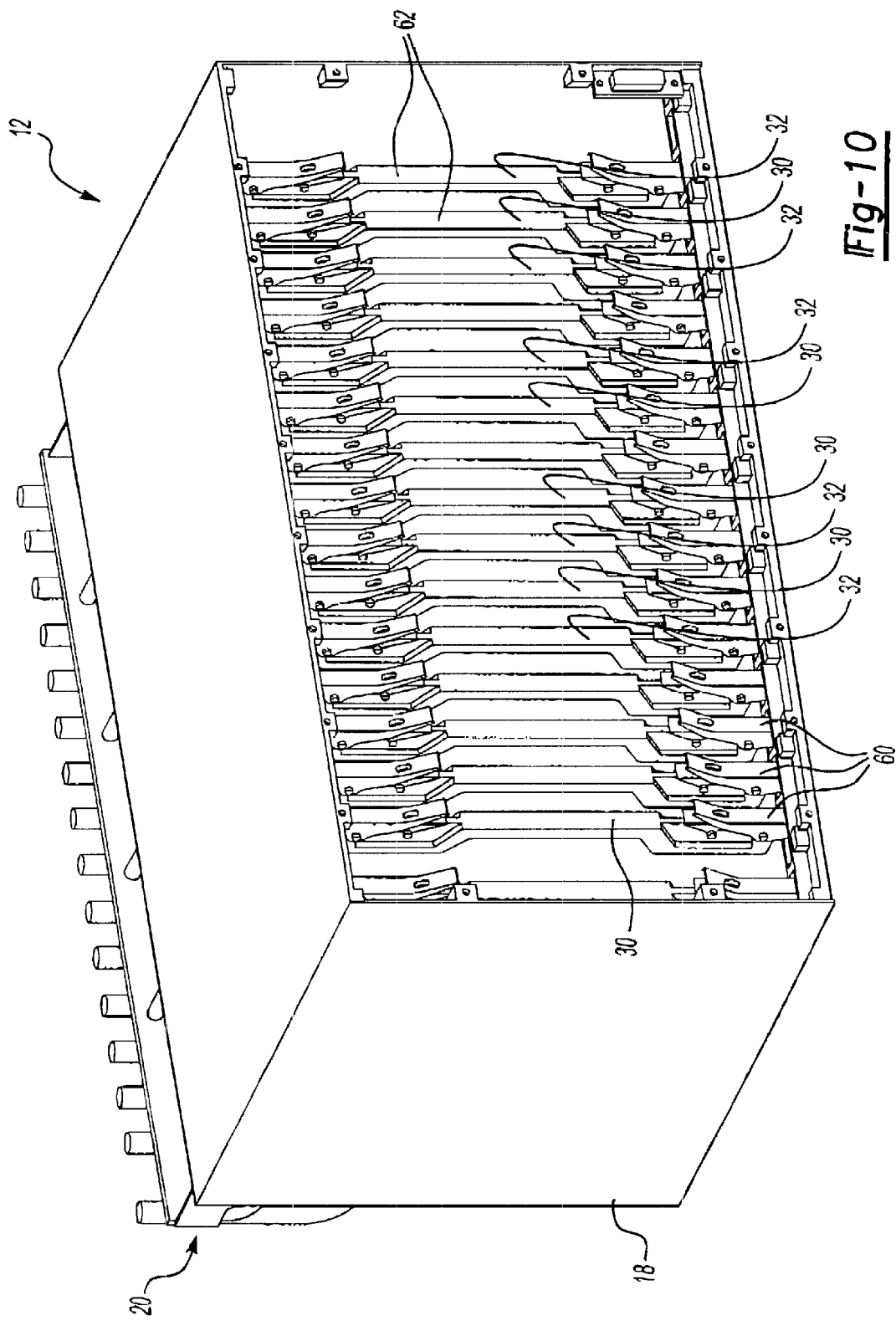
FIG. 10 is a perspective view of an alternate embodiment, similar to FIG. 4 but showing the modules of FIG. 8.

FIG. 10 shows lever actuated power modules 32 and control modules 30 in a parallel configuration similar to that of FIG. 4. The control modules 30 have motherboard connectors 34 and aircraft interface connectors 38 similar to those of the power modules 32. Further, the control modules 30 and power modules 32 can be intermixed with each other as shown.

Figure 11:
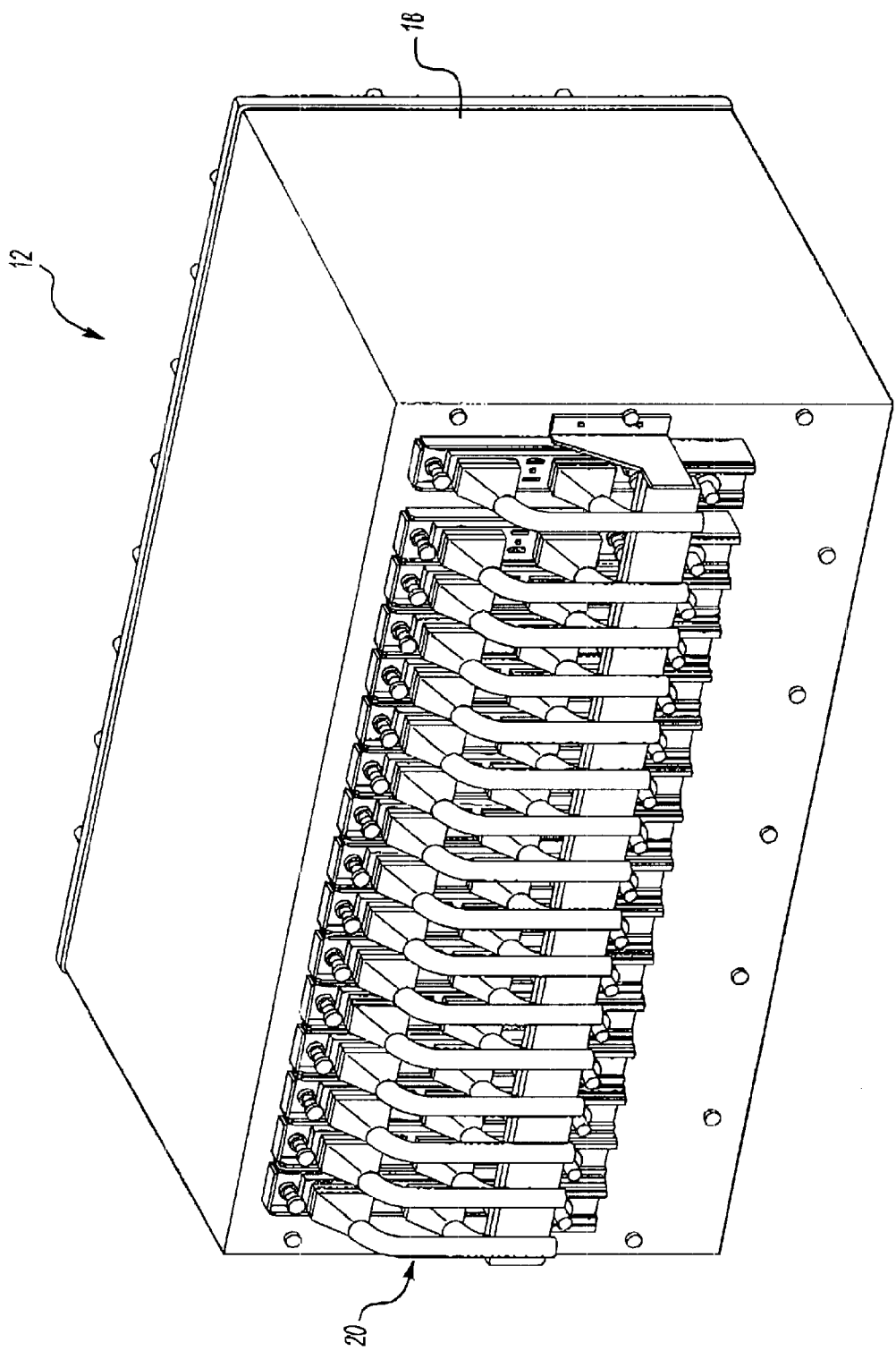
FIG. 11 is a perspective rear view of the embodiment shown in FIG. 5.
Figure 12:
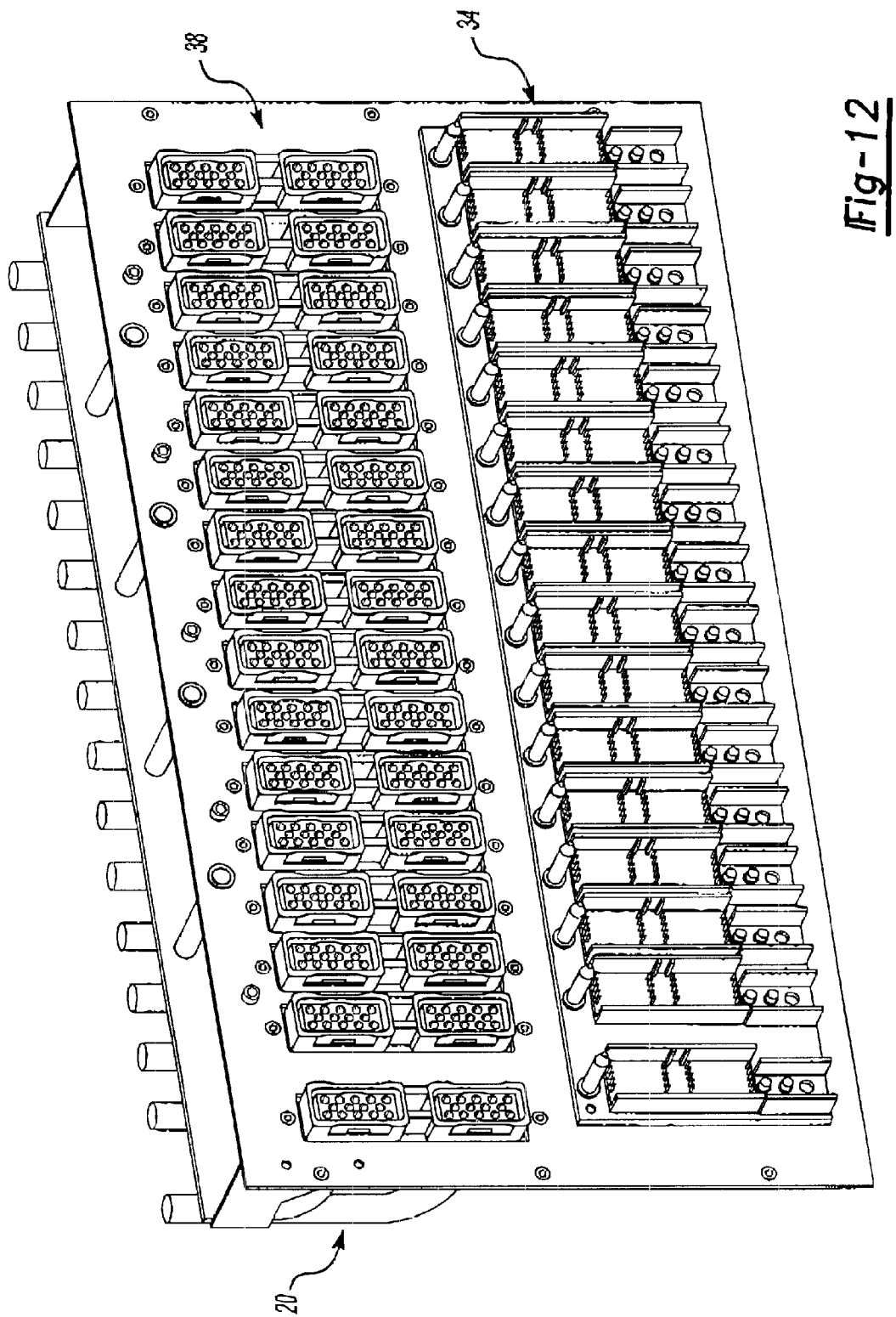
FIG. 12 is a perspective view of one embodiment of the subject invention for the configuration shown in FIG. 10.

FIG. 11 shows an aircraft wiring harness 20 with an external mount on the rear of the chassis 18 similar to that of FIG. 5. Locating the wiring harness 20 on the back or inside portion of the SPDA 12 reduces the possibility of damage to the wiring harness 20 and connectors 34, 38. FIG. 12 shows the chassis with the motherboard connectors 34 and the aircraft interface connectors 38.

The subject invention provides an SPDA 12 that includes LRM modules 32. The modules 32 can be replaced without having to remove the SPDA 12 from the aircraft, which saves a significant amount of time. Post-repair verification is significantly reduced because only the replaced module's connections need to be verified. Further, the SPDA 12 has the capability to provide power to both AC and DC loads and keeps the respective busses separate in the aircraft wiring and to the SPDA.

The aforementioned description is exemplary rather that limiting. Many modifications and variations of the present invention are possible in light of the above teachings. The preferred embodiments of this invention have been disclosed. However, one of ordinary skill in the art would recognize that certain modifications would come within the scope of this invention. Hence, within the scope of the appended claims, the invention may be practiced otherwise than as specifically described. For this reason the following claims should be studied to determine the true scope and content of this invention.

We claim:

1. A power distribution assembly comprising:
   a chassis for attachment to a vehicle;
   a wiring harness externally mounted to said chassis and including separate busses for AC loads and DC loads; and
   a plurality of modules for installation within said chassis with each module including a first connector for attachment to a motherboard and a second connector for attachment to said wiring harness wherein each module is selectively detachable from said chassis for repair or replacement without requiring removal of the other modules.

2. The assembly according to claim 1 wherein said chassis defines a plurality of installation slots for receiving said modules.

3. The assembly according to claim 2 wherein there are more installation slots formed within said chassis than modules installed within said chassis.

4. The assembly according to claim 2 wherein each module includes a plurality of solid state power controllers for controlling multiple DC and/or AC loads within a single module.

5. A power distrbution assembly comprising:
   a chassis for attachment to a vehicle and defining a plurality of installation slots;
   a wiring harness externally mounted to said chassis; and
   a plurality of modules for installation within said installation slots with each module including a first connector for attachment to a motherboard and a second connector for attachment to said wiring harness such that each module is selectively detachable from said chassis for repair or replacement without requiring removal of the other modules wherein each module includes a plurality of solid state power controllers for controlling multiple DC and/or AC loads within a single module and wherein said plurality of solid state power controllers is unique to each of said modules with some of said plurality of solid state power controllers having a fixed amp per load setting, some of said plurality of solid state power controllers having a programmable amp per load setting, or all of said solid state power controllers having a programmable amp per load setting.

6. The assembly according to claim 5 wherein said second connector includes a plurality of pins for connecting said solid state power controllers to a cable from said wiring harness to identify loads serviced by said cable.

7. The assembly according to claim 6 wherein said programmable amp-per-load settings are set based on cable load identification.

8. The assembly according to claim 1 wherein said first and second connectors are mounted to opposite ends of said module with said first connector extending outwardly from said module in a first direction and said second connector extending outwardly from said module in a second direction opposite from said first direction.

9. The assembly according to claim 8 wherein said second connector includes a plurality of configuration pins with both power contacts and signal contacts.

10. The assembly according to claim 9 wherein said power contacts provide a power feed to said module and provide output power to loads requiring high current and wherein said signal contacts provide output power to loads requiring low current and provide said configuration pins for said loads.

11. The assembly according to claim 9 wherein said wiring harness includes a plurality of cables with each cable being strapped to use said configuration pins to uniquely identify each cable.

12. A power distribution assembly comprising:
a chassis for attachment to a vehicle;
a wiring harness externally mounted to said chassis and including separate busses for AC loads and DC loads; and
a plurality of modules for installation within said chassis with each module including a first connector mounted to one end of said module for attachment to a motherboard and a second connector mounted to an opposite end of said module for attachment to said wiring harness wherein each module is selectively detachable from said chassis for repair or replacement without requiring removal of the other modules.

13. The assembly according to claim 1 wherein said first and second connectors are mounted on a common end of each of said modules.

14. The assembly according to claim 13 wherein first and second connectors are generally simultaneously mated with said motherboard and wiring harness respectively when each of said modules is installed within said chassis.

15. The assembly according to claim 13 wherein said second connector is keyed to ensure the proper module is being installed within said chassis.

16. The assembly according to claim 13 wherein said wiring harness is mounted on an exterior end of said chassis.

17. A power distribution assembly comprising:
a chassis for attachment to a vehicle;
a wiring harness externally mounted to said chassis and including an AC bus and a DC bus that is wired separately from said AC bus; and
a plurality of modules for installation within said chassis with each module including a first connector for attachment to a motherboard and a second connector for attachment to said wiring harness, said first and second connectors being mounted on a common end of each of said modules wherein each module is selectively detachable from said chassis for repair or replacement without requiring removal of the other modules.

18. The assembly according to claim 17 wherein DC loads are shared between said DC bus and an essential bus wired separately from both said buses.

19. The assembly according to claim 1 wherein said chassis includes a control section and a power module section.

20. The assembly according to claim 19 wherein said control section includes a first plurality of installation slots for receiving control boards and said power module section includes a second plurality of installation slots for receiving said power modules.

21. The assembly according to claim 20 wherein said second plurality of installation slots is transverse to said first plurality of installation slots.

22. The assembly according to claim 20 wherein said second plurality installation slots is parallel to said first plurality of installation slots.

23. The assembly according to claim 20 wherein said control boards are shop replaceable units and said power modules are line replaceable modules.

24. The assembly according to claim 20 wherein said first plurality of installation slots are intermixed amongst said second plurality of installation slots.

25. The assembly according to claim 1 including a mounting plate for each modules to enclose said module within said chassis.

26. The assembly according to claim 25 including at least one fastener for securing said plate and said module to said chassis.

27. The assembly according to claim 25 wherein said mounting plate includes an identification portion for identifying the type of module enclosed by said mounting plate.

28. A method for distributing power from a vehicle power distribution assembly having a chassis with a plurality of installation slots for receiving modules comprising the steps of:
(a) externally mounting an aircraft wiring harness to the chassis including separating the wiring harness into an AC bus and a DC bus with both busses being independently wired from each other;
(b) attaching a motherboard connector to each module;
(c) attaching an aircraft interface connector to each module;
(d) installing one module into one slot by mating the motherboard connector to a motherboard and mating the aircraft interface connector to the aircraft wiring harness to form a selectively detachable connection to allow the modules to be removed from the chassis for repair or replacement without requiring removal of the other power modules.

29. The method according to claim 28 further including installing a predetermined number of modules into the installation slots wherein the predetermined number varies depending upon vehicle application.

30. The method according to claim 28 further including selectively removing modules for repair or replacement without removing the power distribution assembly from the vehicle.

31. The method according to claim 28 including attaching the motherboard and wiring harness connectors on a common side of the modules.

32. The method according to claim 31 including simultaneously connecting the motherboard connector to the motherboard and the aircraft interface connector to the aircraft wiring harness when the module is inserted within the installation slot.

33. The method according to claim 31 including keying the aircraft interface connector to ensure that the correct module is being installed within the correct installation slot.

34. The method according to claim 31 including mounting the wiring harness on an inwardly facing external surface portion of the chassis.

35. The method according to claim 28 including attaching the motherboard and wiring harness connectors on opposite sides of the module.

36. The method according to claim 28 including separating the chassis into a control section having a first plurality of installation slots for receiving control modules and a power section having a second plurality of installation slots for receiving the power modules.

37. The method according to claim 36 including orientating the first plurality of installation slots parallel to the second plurality of installation slots.

38. The method according to claim 37 including orientating the first plurality of installation slots transversely to the second plurality of installation slots.

39. The method according to claim 28 including controlling multiple DC and/or AC loads within a single power module with solid state power controllers.

40. A method for distributing power from a vehicle power distribution assembly having a chassis with a plurality of installation slots for receiving modules comprising the steps of:

(a) externally mounting an aircraft wiring harness to the chassis;

(b) attaching a motherboard connector to each module;

(c) attaching an aircraft interface connector to each module;

(d) installing one module into one slot by mating the motherboard connector to a motherboard and mating the aircraft interface connector to the aircraft wiring harness to form a selectively detachable connection to allow the modules to be removed from the chassis for repair or replacement without requiring removal of the other power modules; and (e) utilizing some fixed solid state power controllers and some programmable solid state power controllers for each power module.

41. The method according to claim 40 including identifying service loads for the power module by connection of the wiring harness connector to the wiring harness.

42. The method according to claim 41 including programming the programmable solid state power controllers after identification of the service loads.

43. The method according to claim 28 further including installing a predetermined number of power modules into the installation slots with some modules providing AC power and some modules providing DC power.

44. The method according to claim 28 including utilizing all programmable solid state power controllers for each controller.

* * * * *